United States Patent [19]

Reedy

[11] 4,069,428

[45] Jan. 17, 1978

[54] TRANSISTOR-TRANSISTOR-LOGIC CIRCUIT

[75] Inventor: Dennis Conway Reedy, Stormville, N.Y.

[73] Assignee: International Business Machines Corporation, Armonk, N.Y.

[21] Appl. No.: 719,887

[22] Filed: Sept. 2, 1976

[51] Int. Cl.² .................. H03K 19/08; H03K 19/12; H03K 19/36
[52] U.S. Cl. .................. 307/215; 307/200 A; 307/213; 307/299 A; 307/317 A
[58] Field of Search .......... 307/202, 215, 213, 200 A, 307/299 A, 317 A

[56] References Cited

U.S. PATENT DOCUMENTS

| | | | |
|---|---|---|---|
| 2,993,128 | 7/1961 | Carroll | 307/202 |
| 3,083,303 | 3/1963 | Knowles et al. | 307/215 |
| 3,508,078 | 4/1970 | Komamiya et al. | 307/200 A |
| 3,904,979 | 9/1975 | Suzuki | 307/202 |

*Primary Examiner*—John S. Heyman
*Attorney, Agent, or Firm*—Theodore E. Galanthay

[57] ABSTRACT

Disclosed is a transistor-transistor-logic (TTL) circuit which is testable by D. C. Testing Techniques. The improvement includes a high impedance network for providing sufficient base drive to drive the output transistor into conduction when the malfunctioning input transistor fails to provide a turn-off logic level. The high impedance network can be a Schottky barrier diode and an epitaxial resistor connected in a series path between a potential supply and the base region of the output transistor.

13 Claims, 9 Drawing Figures

$D = \overline{A \cdot B \cdot C}$

TRANSISTOR-TRANSISTOR-LOGIC CIRCUIT

BACKGROUND OF THE INVENTION

1. Field of the Invention

This is an improved TTL circuit and more particularly a TTL circuit that is testable by D.C. Testing Techniques.

2. Description of the Prior Art

Transistor-transistor-logic (TTL) circuits are notoriously well-known in the art and it is well-known to place a hundred or more of these circuits on a single semiconductor chip. When a lage number of such circuits are placed on a single semiconductor chip, complex logic functions are achievable even though external contacts can be made only to a limited number of these circuits. Whenever there are inaccessable circuit nodes, testing becomes a problem.

FIG. 1 illustrates one type of prior art circuit in which a TTL circuit is connected as a NAND gate. Assuming that the input terminals A, B, and C, and the output terminal D are not externally accessible, then this circuit can not be completely tested by D.C. Techniques. Specifically, a defect in input transistor T1, such as a base to emitter short circuit, can not be detected. Assuming first that all the logic inputs at terminals A, B, and C are at a logical up level, T1 is cut off and intermediate node X is charged to a logic up level by means of more positive potential V1 through resistor R1 and Schottky barrier diode D1. This up logic level turns output transistor T2 on causing the output terminal D to assume a down logic level such as potential V2 which may be at ground potential. Resistor R2 forms a load resistance for transistor T2 and usually has a value approximately equal to that of R1.

By bringing any one of the input terminals to a down level, node X would also be brought to a down level. Assuming, however, a defect in input transistor T1 such as a base to emitter short circuit, for example, then node X will not be brought down as intended. Rather, over an extended period such as 80 to 100 nanoseconds, the reverse biased Schottky diode D1 (and the reversed biased collector to base junction of T1) will provide sufficient leakage to bring node X to a down level. This in turn will turn off T2 permitting the output D to be charged to an up level through resistor R2. For this reason, a correct output condition will be indicated after 80 to 100 nanoseconds even though a defect is present in transistor T1. Such a defect can only be detected by an A.C. test which will note that the gate has not switched in the customary time (approximately 7 nanoseconds). A.C. Testing, however, is expensive, time consuming, and generally impractical for a high volume manufacturing operation.

A second type of prior art circuit is illustrated in FIG. 2. FIG. 2 includes all the elements of FIG. 1 and has been correspondingly labeled with reference numerals. It is noted that FIG. 2 further includes resistor R3 which is connected to the path coupling transistors T1 and T2. In order to optimize power/performance characteristics in the FIG. 2 prior art embodiment, it is customary to set the values of resistors R1 and R3 equal to each other and twice the resistance value of R2. Thus, whereas in the FIG. 1 embodiment, R1 and R2 might typically be set around 3 K ohms, in the FIG. 2 embodiment only R2 would be set equal to 3 K ohms. Resistors R1 and R3 would be set equal to approximately 6 K ohms.

Thus, even though the FIG. 2 prior art circuit is D.C. testable, it occupies a significantly larger area on a semiconductor chip. Not only is an additional resistor R3 required, but the need for larger resistances further increases the area requirements. Moreover, since a higher resistance dissipates more heat, in the case of high power circuits, for comparable current levels additional power consumption and cooling must be considered. In the illustrated NPN technology of FIG. 2, the resistors are customarily formed in the P-type "base" diffusions having a resistivity of approximately 180 ohms per square. Once the resistivity of the material has been established, the resistance of a particular resistor is determined by its dimensions of length and width. Resistors are made as narrow as the yield tolerances allow so that length becomes the dimension by which resistance can be adjusted. Therefore, not only will the additional resistor R3 take up extra room, but it as well as formerly smaller resistance R1 will be significantly longer than R2. Although there are known techniques for increasing resistance in as limited an area as possible, such as running a resistor in a serpentine pattern or various "pinch" resistor techniques, these all take up additional space over the prior art circuit illustrated in FIG. 1.

Accordingly, the prior art circuit of FIG. 1 has advantages over the prior art circuit of FIG. 2, together with the one significant disadvantage that it is not testable by D.C. techniques.

SUMMARY OF THE INVENTION

It is accordingly a primary object of this invention to provide an improved logic circuit that is testable by D.C. techniques:

It is another object of this invention to provide a transistor-transistor-logic circuit characterized by occupying a minimal area on a semiconductor chip and also being D.C. testable;

Lastly, it is an object of this invention to provide a D.C. testable logic circuit with the same power/performance characteristics as similar logic circuits which were previously not testable by D.C. techniques.

In accordance with the present invention, a circuit means is electrically coupled to the base region of an output transistor in a TTL circuit configuration. When a malfunction, such as a base to emitter short circuit, occurs in the input transistor of the TTL configuration, the circuit means will bias the output transistor into a first binary state when the input transistor fails to provide a current path for biasing the output transistor into a second binary state. Thus, in an NPN implementation, a down level binary input to the input transistor will normally switch the base region of the output transistor to a down binary level turning the output transistor off. In a case where the input transistor malfunctions, such as due to a base to emitter short, a down level input will not switch the output transistor to a down level, but eventually, through reverse diode leakage, transistor T2 will be turned off. In order to prevent the output transistor from being turned off in the case of a defective input transistor, the circuit means electrically coupled to the base region of the output transistor provides the necessary current drive to keep the output transistor on.

The circuit means coupled to the base region of the output transistor is usually connected to the more positive potential supply and implemented as a resistor and diode forming a series electrical path between the more positive potential and the base region of the NPN type output transistor. Unlike conventional 3 resistor TTL NAND cells, the purpose of the resistor-diode network of the present invention is to act as a high impedance shunt to provide the needed base drive to the output transistor. In integrated form, the added resistor is integrated as part of the collector region of the input transistor. Thus, the added resistor is an epitaxial resistor of high impedance value since the epitaxial layer has a high resistivity per square. The series connected diode is preferably a Schottky diode that is formed by the contact to the epitaxial resistor. If a value of epitaxial resistor is needed in excess of that obtainable by the material resistivity and the area contraints, it can be made into a pinched resistor by including a P-type base diffusion into the epitaxial layer. Such pinched resistor structures are well-known in the art.

The foregoing and other objects, features, and advantages of this invention will be apparent from the following more particular description of the preferred embodiments of the invention as illustrated in the accompanying drawings.

DETAILED DESCRIPTION OF THE INVENTION

Figure 1:
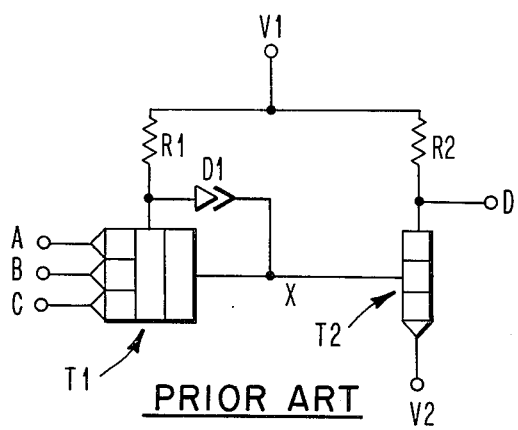
FIG. 1 is a circuit diagram of the prior art.
Figure 2:
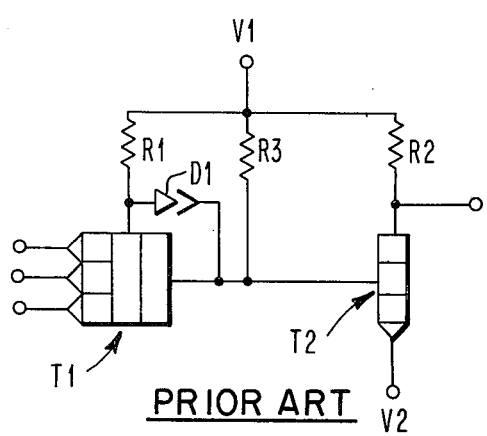
FIG. 2 is a circuit diagram of another form of the prior art.

The prior art circuits illustrated in FIGS. 1 and 2 were described during the discussion of the prior art. In its essence, the present invention is an improvement over the FIG. 1 type of prior art circuit. The circuit of FIG. 1 which utilizes fewer components and occupies less semiconductor space than the circuit of FIG. 2 is rendered DC testable by the present invention.

Figure 3:
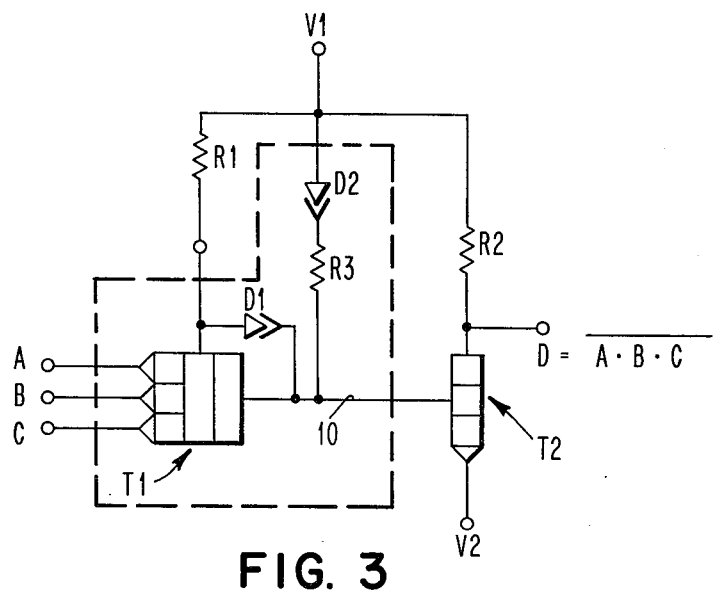
FIG. 3 is a circuit diagram of a preferred embodiment of this invention.

The FIG. 3 embodiment illustrates a transistor-transistor-logic (TTL) circuit in a NAND logic configuration. An input transistor T1, having a collector region, a base region, and a plurality of emitter regions, is of the type conventionally used as input transistors to TTL circuits. Three input terminals A, B, and C are shown. It is well-known to fabricate transistors having one or more emitters and the number of inputs is determined by the desired number of input legs required to perform a particular logic function. For example, if T1 had only a single input, the output terminal D would merely invert the input. In the illustrated 3 input example, the output terminal D would provide the NAND function shown on the drawing.

An output transistor T2 having a collector region, an emitter region and at least one base region is similarly know in the prior art. An electrical path 10 couples the base region of the output transistor T2 to the collector region of the input transistor T1. As illustrated, electrical path 10 consists of a conductor. It is, however, also known to place one or more transistors and/or other components in a network providing an electrical path 10. A first source of potential V1 is electrically coupled by means of a first impedance R1 to the base region of the input transistor T1 and by means of a second impedance R2 to the collector region of the output transistor T2. R2 forms a load resistor for output transistor T2 and the output D is thus provided at the collector of output transistor T2. A second source of potential V2 is electrically coupled to the emitter region of the output transistor T2. In the illustrated NPN transistor configuration, V1 is usually more positive than V2. In a low power configuration, V1 can be in the order of plus 2 volts while V2 is ground potential. Schottky diode D1 connects the base and collector of input transistor T1 and is customarily used in this type of circuit to prevent input transistor T1 from going into saturation. To this point, the circuit of FIG. 3 is quite similar to the prior art circuit of FIG. 1 with the possible exception of variation in component values as will be described later herein.

FIG. 3 further illustrates circuit means including resistor R3 and Schottky barrier diode D2 connected in series with each other and coupled to the base region of the output transistor T2. The anode of diode D2 is coupled to V1. As will be explained in greater detal, in integrated form, the resistor R3 is actually an extension of the epitaxial collector region of transistor T1 and diode D2 is formed by a metallic contact to that collector region.

Figure 5:
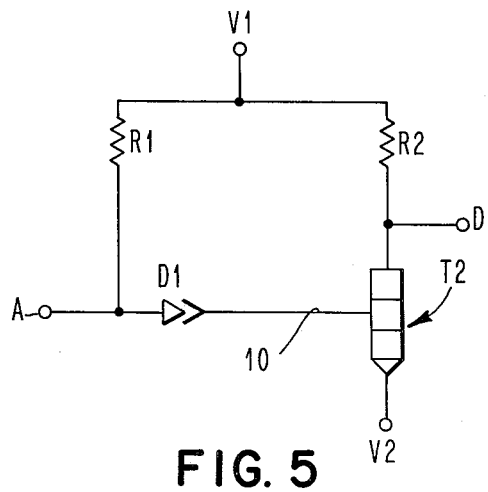
FIG. 5 is an equivalent circuit of FIG. 1 in the case where T1 is defective.
Figure 4:
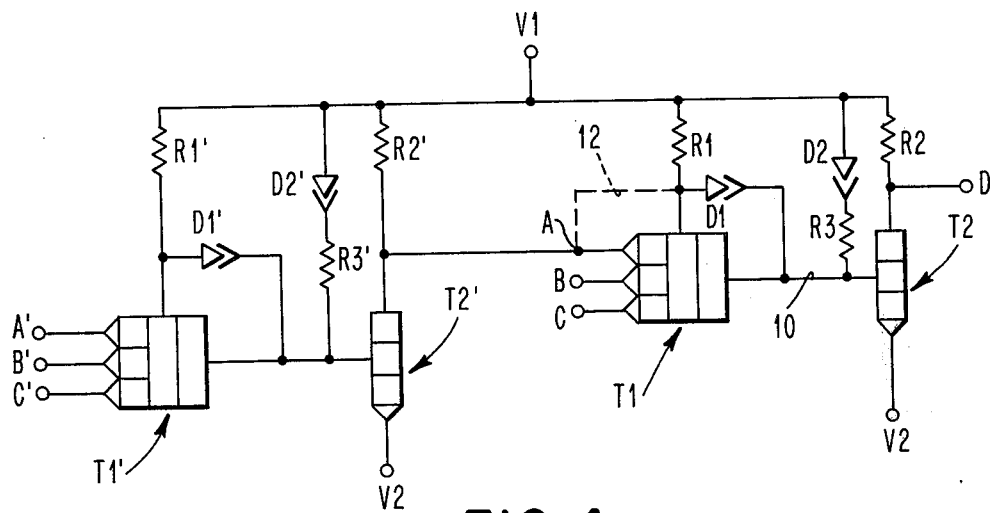
FIG. 4 is a circuit diagram of the present invention illustrating several stages.

Refer now to FIG. 4, in which a pair of circuits of the type illustrated in FIG. 3 have been connected together. Consistent reference numerals have been utilized insofar as practical, and the components forming the second cell have been designated by prime notation. In practice, it is well-known that a hundred or more such "cells" or circuits, instead of the two illustrated in FIG. 4, are placed on a single semiconductor substrate. The number of available input and output (I/O) terminals that are available leave a large number of inaccessable circuit nodes. Defects within such buried portions of the circuit are difficult to locate. One such defect that has been found to occur in the fabrication of circuits is a base to emitter short circuit as illustrated by the dashed line 12. Such a base to emitter short could be caused, for example, by adjacent metallurgy coming in contact. A base to emitter short circuit will effectively remove T1 from the circuit and result in the equivalent circuit of FIG. 5. The FIG. 5 equivalent circuit illustrates a defect in T1 as for example in the prior art circuit of FIG. 1. By the improvements of the present invention, including the addition of series connected diode D2 and resistor R3, the equivalent circuit of FIG. 6 results. Note, that in both cases, the input transistor T1 is removed from the circuit. In the FIG. 6 equivalent circuit, however, diode D2 and resistor R3 provide an additional current path to the base of transistor T2.

Figure 7:
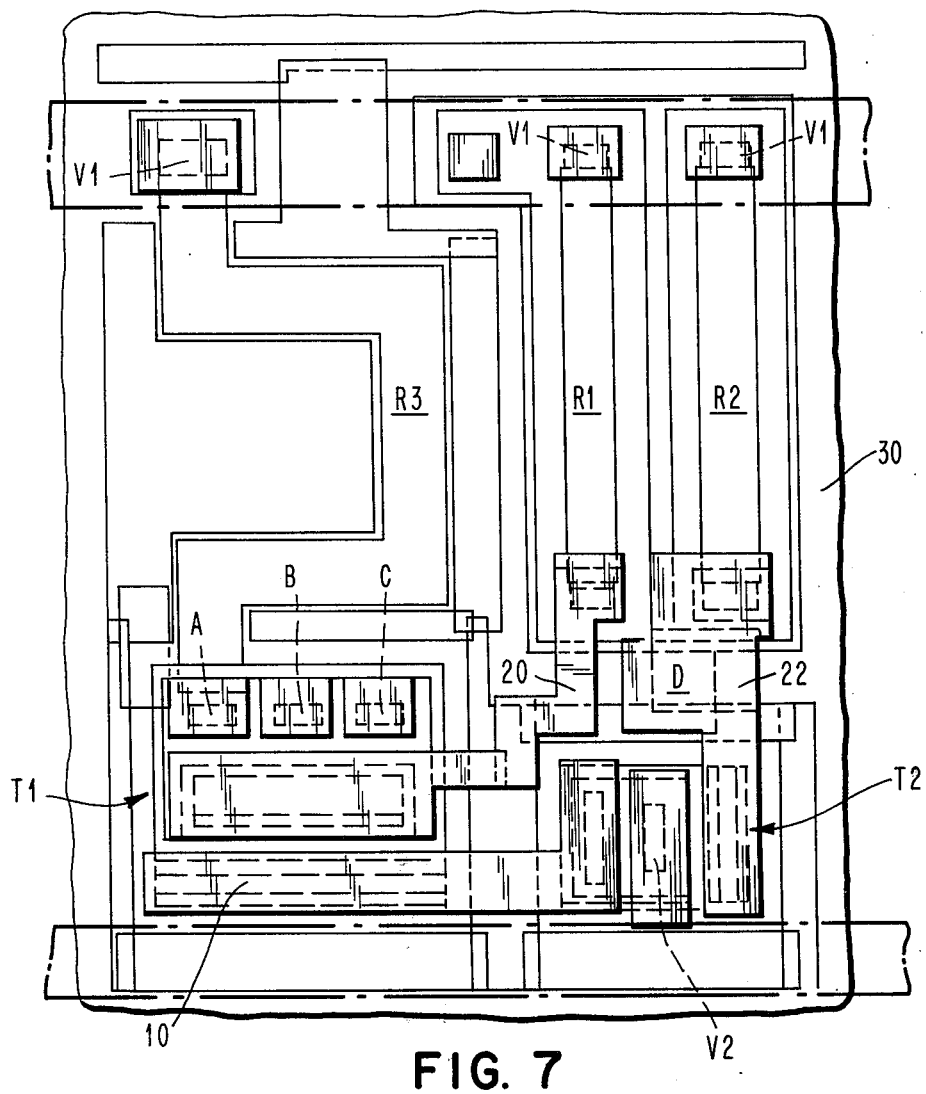
FIG. 7 is a top view schematic representation of the semiconductor structure illustrated in FIG. 3.

Refer now to FIG. 7 which is a top view of an exemplary semiconductor structure illustrating the circuit of FIG. 3 in integrated form. Input transistor T1 is shown fabricated with three emitter regions and terminals A, B, and C. The base region of T1 is connected by means of conductor 20 to resistor R1. Both the base of T1 and resistor R1 are formed by means of a P-type base diffusion. The other end of resistor R1 is a contact for ultimate connection to first potential V1. The collector of T1 is coupled to the base of T2 by means of conductive path 10, as illustrated. The emitter of T2 is connected to potential supply V2, while the collector of T2 is connected to output terminal D by means of metallized or otherwise conductive path 22. Schottky diode D1 is connected between the base of T1 and the collector of T1 as illustrated. To this point, the semiconductor structure is quite similar to the prior art illustrated in FIG. 1. A significant departure from the prior art occurs by the addition of resistor R3 which is an extension of the N-type collector region of transistor T1. Epitaxial resistor region R3 has a metallic contact thereto forming diode D2 which is ultimately connected to the potential supply V2. The structure illustrated by the FIG. 7 top view is the integrated embodiment of the circuit illustrated by FIG. 3. The broken border around the FIG. 7 representation indicates that a hundred or more of these cells or circuits are all formed on the same monolithic chip.

Figure 8:
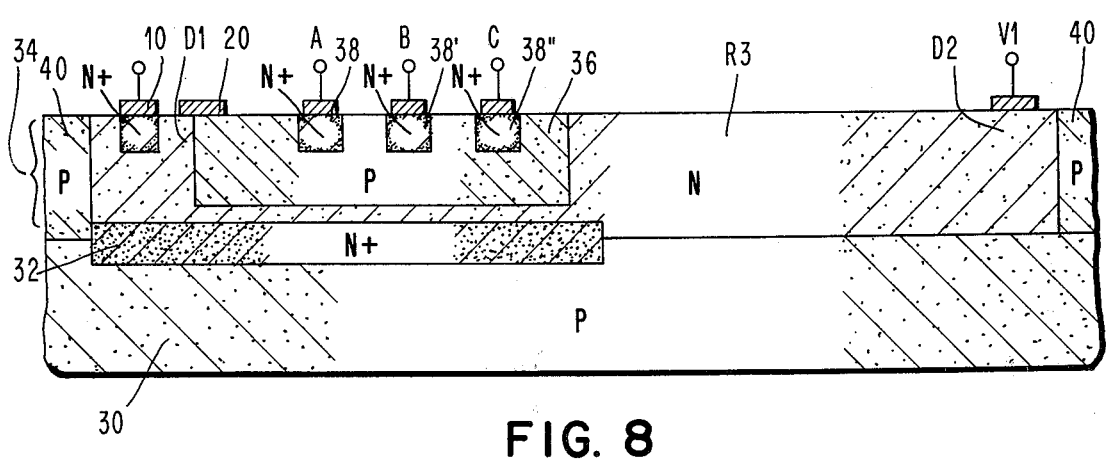
FIG. 8 is a cross-sectional semiconductor structure schematic representation of a portion of FIG. 3 enclosed within dotted lines.

In order to more particularly point out the structural arrangement of the present invention, refer now to FIG. 8. FIG. 8 is a cross sectional view of the portion of the circuit of FIG. 3 found within the dotted lines. Thus, P-type resistors R1 and R2 as well as output transistor T2 have been omitted from the FIG. 8 drawing as they are conventional.

With continued reference to FIG. 8 as well as FIGS. 7 and 3, a substrate 30 doped with impurities of a first conductivity type, such as P-type, is provided. A first semiconductor region 32 doped with impurities of a second conductivity type such as N+ is buried within the overall structure and forms a subcollector for input transistor T1. Typically, such subcollectors have a high doping concentration and correspondingly low resistivity. Subcollectors are formed by either diffusing or implanting the impurities into the substrate and subsequently depositing an epitaxial layer 34 thereover. Such epitaxial layer 34 is conventionally lightly doped with N-type impurities and the N− subcollector outdiffuses into the epitaxy, as shown. The base region of input transistor T1 is formed by a P-type region 36 diffused or implanted into epitaxial layer 34. This second semiconductor region 36 is disposed over the first semiconductor region forming a collector base PN junction primarily in the junction area nearest the N+ subcollector. Next, a plurality of third semiconductor regions 38, 38', and 38'' are formed by introducing N-type impurities into the P-type region 36 at its upper surface. Emitters are also usually heavily doped and designated by N+. An isolation region 40 normally surrounds an input transistor T1. A diffusion type isolation is shown although numerous isolation techniques including dielectric isolation, recessed oxide isolation, and various combinations of isolation techniques are well-known and could be used to accomplish the identical function. FIG. 8 further illustrates contact to the collector region of T1 which ultimately forms an electrical path 10 coupling the collector region of T1 to the base region of T2. Also, Schottky diode D1 is formed by the metallic contact to the lightly doped N-type epitaxial region, the conductor 20 forming a conductive path to the P-type resistor R1. Although not specifically shown in FIG. 8, the resistor R1 in FIG. 7 is a P-type region similar to the region 36 illustrated in FIG. 8. The resistor R2 is formed in an identical manner to preserve tracking with respect to process variations and variations in temperature of operation.

FIG. 8 illustrates in further detail the epitaxial resistor R3 which can be seen as a fourth semiconductor region contiguous with the subcollector region 32 and lightly doped with N-type impurities. Thus the resistivity of the region R3 is quite high and the resistance value of R3 is further increased by the serpentine routing as more particularly shown in the top view of FIG. 7. The region R3 has an electrical connection by means of Schottky diode D2 to the potential V1.

The resistivity and dimensions of the epitaxial material forming resistor R3 is such that a resistance of 12,000 ohms is readily attainable. By providing a Schottky contact D2 instead of an ohmic contact, an additional diode drop is provided. This diode voltage drop which is known to be in the order of 450 millivolts can contribute an additional effective resistance of 7,500 ohms at 50 microamps. This total of 19,500 ohms compares with approximately 3,000 ohms customarily employed in P-type diffusion resistors R1 and R2.

If the circuit design requires a value of R3 larger than obtainable by the epitaxial resistivity and area constraints, R3 can be made into a pinched resistor by including a P-type base diffusion in the epitaxial extension.

With R3 and diode D2 forming such a significantly larger resistance than resistors R1 and R2, the resistance of R1 may be maintained at a value approximately equal to that of R2, thereby maintaining the FIG 1 type prior art circuit design. It was previously pointed out that in the three resistor circuit design illustrated by FIG. 2, R1 and R3 would normally be required to be double the value of R2. In the present case, performance can be optimized by increasing the resistance value by a nominal amount (typically less than 10%). Such a small variation in the relative values of R1 and R2 is achievable with only minor fabrication alterations.

OPERATION

The circuit of the present Invention as illustrated in FIGS. 3 and 4 operate in a similar maner as the prior art circuit illustrated in FIG. 1. Referring to FIG. 3 briefly, when any one or more of the inputs A, B, or C, are at a down level, T1 will be in a conductive state which will be defined as a first binary state. In this case, with T1 on, current is drawn through the series connection of R1 and D1 which have a resistance high enough so that electrical path 10 is maintained at a down level. The much higher resistance of series connected diode D2 and resistor R3 will also provide some current at this point in time. As was previously pointed out, a slight increase in the resistance of R1 will compensate for this if it is desired to draw the identical current through T1 as was drawn prior to the addition of R3 and D2. With electrical path 10 at a down level, transistor T2 is maintained non-conductive which is a second binary state as opposed to the first binary state of T1 which is "on" at this time. With T2 being off, the output is brought to an up level by means of the electrical path through R2.

In the case where all of the inputs A, B, and C are brought to an up level, transistor T1 is rendered non-conductive placing it in its second binary state, so that current passing through R1 and D1 will bring electrical path 10 to an up level. It is again noted that some current will also flow through D2 and R3 contributing to a somewhat faster rise time of the signal on electrical path 10. As electrical path 10 is brought to an up level, transistor T2 is rendered conductive (placed in its first binary state) bringing the output to a down logic level.

Those skilled in the art will recognize the foregoing operation as the performance of a logical NAND function. Equivalent circuits such as those produced by PNP transistors instead of the illustrated NPN transistors could be utilized with a corresponding modification of relative potential source and logic levels. Also, other logic functions, such as an invert function, would be obviously obtainable from the illustrated circuit. Moreover, an output could be taken directly from electrical path 10 providing an in-phase AND output.

Figure 9:
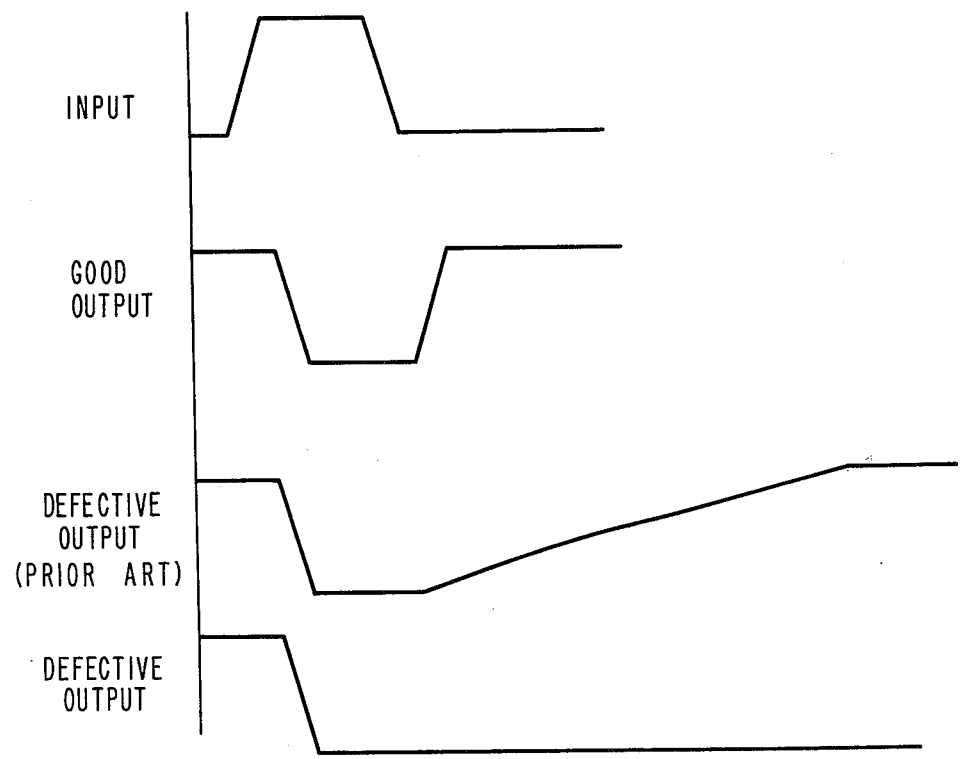
FIG. 9 is a series of waveform diagrams.

The foregoing operation is illustrated in further detail by the waveform diagrams of FIG. 9. Particularly, an input waveform of the type illustrated applied at node A (FIG. 4) will provide an inverted and slightly delayed output waveform as a designated "good output" at node D (FIG. 4). This will occur if there are no defects in the circuit.

Assume now, that there is a defect in transistor T1, as for example a base to emitter short illustrated by the dotted line 12 in FIG. 4. Such a short circuit in the circuit of the type illustrated by FIG. 1 of the prior art results in an equivalent circuit of the type illustrated in FIG. 5. With an up level input, at A, the diode D1 (as well as the base collector junction of T1 in case it is operational) provides an up level to the base of T2 bringing the output D to a down level. Thus, the defective output is quite similar to a good output. However, when one of the inputs goes to a down level, transistor T1 will not switch electrical path 10 to a down level. Thus, transistor T2 will remain on maintaining the output node at a down level. In the prior art, leakage paths such as through reverse biased diode D1, eventually permit electrical path 10 to decay to a down level causing T2 to turn off and bringing the output to an up level. This occurs, however, after only 80 to 100 nanoseconds as opposed to the more customary delay of 7 nanoseconds. In a DC test, however, differences in rise and fall time are not detected, and a correct output pattern is seen notwithstanding a defective input transistor T1 buried within the network.

Figure 6:
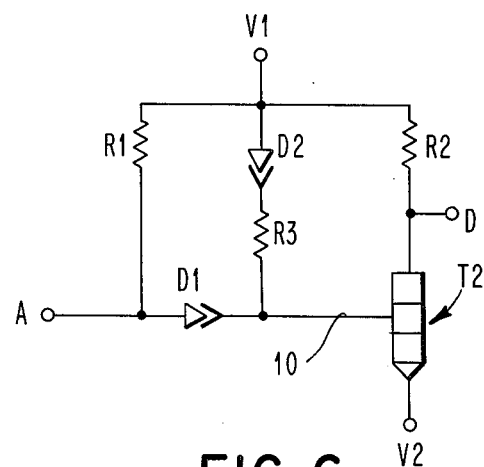
FIG. 6 is an equivalent circuit of FIG. 3 when T1 is defective.

By the circuit of the present invention, however, as illustrated in FIGS. 3, 4, and the equivalent circuit of FIG. 6, the foregoing undesirable phenomenon is cured. Specifically, as one of the input terminals is brought to a down level, the normal leakage process from electrical path 10 is prevented by current flowing into the node from potential source V1 through diode D2 and resistor R3. This current provides sufficient base drive to output transistor T2 to keep it on. Since T2 remains on, the output remains down, eventhough one of the inputs is also down. A DC test will detect this as an error so that defective parts will no longer be shipped to a customer.

What has then been described is an improved TTL logic circuit which has the advantages of compactness while eliminating certain disadvantages such as providing a means for DC testability.

While the invention has been particularly shown and described with reference to preferred embodiments, it wll be understood by those skilled in the art that various changes in form and detail may be made therein without departing from the spirit and scope of the invention.

What is claimed is:

1. An improved monolithically integrated transistor-transistor-logic circuit comprising:
   an input transistor having a collector region, a base region, and at least one emitter region connected to an input;
   an output transistor having a colletor region, a base region, and at least one emitter region;
   an electrical path coupling the base region of said output transistor to the collector region of said input transistor;
   a first source of potential electrically coupled by means of a first impedance to the base region of said input transistor and by menas of a second impedance to the collector region of said output transistor;
   a second source of potential electrically coupled to the emitter region of said output transistor; and
   circuit means electrically coupled to said base region of said output transistor for biasing said output transistor into a first binary state when said input-tansistor malfunctions by failing to provide a current path for biasing said output transistor into a second binary state;
   said circuit means electrically coupled to said base region of said output transistor being a high impedance current path comprising a series connected Schottky Barrier Diode and a third impedance.

2. An improved circuit as in claim 1 wherein an output is taken from the collector region of said output transistor, said circuit further comprising:
   a unidirectionally conducting means electrically connecting the base region and collector region of said input transistor.

3. An improved circuit as in claim 2 wherein said unidirectionally conducting means is a Schottky barrier diode.

4. An improved circuit as in claim 1 wherein said circuit means electrically coupled to said base region of said output transistor is also electrically coupled to said first source of potential providing a high impedance current path between said first source of potential and said base region of said output transistor.

5. An improved monolithically integrated transistor-transistor-logic circuit comprising:
   an input transistor having a collector region, a base region, and at least one emitter region connected to an input;
   an output transistor having a collector region, a base region, and at least one emitter region;
   an electrical path coupling the base region of said output transistor to the collector region of said input transistor;
   a first source of potential electrically coupled by means of a first impedance to the base region of said input transistor and by means of a second impedance to the collector region of said output transistor;
   a second source of potential electrically coupled to the emitter region of said output transistor; and
   circuit means electrically coupled to said base region of said output transistor for biasing said output transistor into a first binary state when said input transistor malfunctions by failing to provide a current path for biasing said output transistor into a second binary state;
   said input transistor and said output transistor being NPN transistors;
   said first source of potential having a more positive value than said second source of potential; and
   said input transistor having a plurality of emitter regions;

said improved circuit providing a NAND logical output function at the collector of said output transistor.

6. An improved circuit as in claim 5 wherein said means electrically coupled to said base region of said output transistor conducts current only when at least one of the emitter regions of said input transistor is brought to a potential level approximating the value of said second source of potential thereby bringing said electrical path more than one diode voltage drop below the potential level of said first source of potential.

7. An improved circuit as in claim 5 further comprising: a unidirectionally conducting means electrically connecting the base region and collector region of said input transistor.

8. An improved circuit as in claim 7 wherein said unidirectionally conducting means is a Schottky Barrier Diode 9. An improved circuit as in claim 5 wherein said circuit means electrically coupled to said base region of said output transistor is also electrically coupled to said first source of potential providing a high impedance current path between said first source of potential and said base region of said output transistor.

10. An improved monolithically integrated transistor-transistor-logic circuit wherein the integrated form of said circuit, in part, comprises:
  a semiconductor body having a substrate doped with impurities of a first conductivity type;
  an input transistor having a collector region, a base region, and at least one emitter region connected to an input;
  an output transistor having a collector region, a base region, and at least one emitter region;
  an electrical path coupling the base region of said output transistor to the collector region of said input transistor;
  a first source of potential electrically coupled by means of a first impedance to the base region of said input transistor and by means of a second impedance to the collector region of said output transistor;
  a second source of potential electrically coupled to the emitter region of said output transistor; and
  circuit means electrically coupled to said base region of said output transistor for biasing said output transistor into a first binary state when said input transistor malfunctions by failing to provide a current path for biasing said output transistor into a second binary state;
  a first semiconductor region doped with impurities of a second conductivity type buried within said body and forming a subcollector for said input transistor;
  a second semiconductor region doped with impurities of said first conductivity type disposed over said first semiconductor region, and forming a base region for said input transistor;
  at least one third semiconductor region doped with impurities of said second conductivity type disposed in said second semiconductor region at its upper surface forming at least one emitter region for said input transistor;
  a fourth semiconductor region contiguous with said first semiconductor region and doped with impurities of said second conductivity type having a doping concentration less than the doping concentration of said first semiconductor region, thereby providing a semiconductor region of higher resistivity than the resistivity of said first semiconductor region; and
  said fourth semiconductor region having an electrical connection to said first source of potential.

11. An improved monolithicaly integrated transistor-transistor-logic circuit as in claim 10 wherein said electrical connection comprises:
  a Schottky barrier diode.

12. An improved monollthically integrated transistor-transitor-logic circuit as in claim 10 wherein said fourth semiconductor region comprises:
  an epitaxial layer deposited on siad substrate.

13. An improved monolithically integrated transistor-tranisistor-logic circuit as in claim 10 further comprising:
  fifth and sixth semiconductor regions doped with impurities of said first conductivity type forming said first and second impedance means, respectively.

* * * * *